United States Patent
Moon (10) Patent No.: US 8,143,648 B1
(45) Date of Patent: Mar. 27, 2012

(54) UNIPOLAR TUNNELING PHOTODETECTOR

(75) Inventor: Jeong-Sun Moon, Moorpark, CA (US)

(73) Assignee: HRL Laboratories, LLC, Malibu, CA (US)

(*) Notice: Subject to any disclaimer, the term of this patent is extended or adjusted under 35 U.S.C. 154(b) by 545 days.

(21) Appl. No.: 11/836,638

(22) Filed: Aug. 9, 2007

Related U.S. Application Data (60) Provisional application No. 60/837,338, filed on Aug. 11, 2006.

(51) Int. Cl.
*H01L 31/0328* (2006.01)

(52) U.S. Cl. ............... 257/194; 257/79; 257/21

(58) Field of Classification Search .......... 257/233, 257/292, 293, 431–466, E31.115, E31.121, 257/E33.076, 21, 400.4, 594; 438/48, 54, 438/65, 69, 70
See application file for complete search history.

(56) References Cited

U.S. PATENT DOCUMENTS

| | | | | |
|---|---|---|---|---|
| 4,691,215 A | * | 9/1987 | Luryi | 257/23 |
| 4,878,095 A | * | 10/1989 | Bending et al. | 257/23 |
| 5,239,550 A | * | 8/1993 | Jain | 372/45.01 |
| 5,986,291 A | * | 11/1999 | Currie et al. | 257/194 |
| 6,720,589 B1 | * | 4/2004 | Shields | 257/194 |
| 6,885,023 B2 | * | 4/2005 | Shields et al. | 257/21 |
| 2002/0074555 A1 | * | 6/2002 | Kim et al. | 257/79 |
| 2002/0092987 A1 | * | 7/2002 | Cho et al. | 250/338.4 |
| 2006/0267007 A1 | * | 11/2006 | Salzman et al. | 257/46 |

OTHER PUBLICATIONS

Abedin, M.N., et al., IEEE Trans. Electron. Devices. 51,2013 (2004).
Bhattacharya, P., et al., Appl. Phys. Lett. 86,191106 (2005).
Blakesley, J.C., et al., Phys. Rev. Lett, 94, 67401 (2005).
Campbell, J.C., et al., IEEE J. Quant. Electron., 17,264 (1981).
Eisenstein, J.P., et al., Appl. Phys. Let.57, 2324 (1990).
Hiskeu, P., et al., Applied Optics. 39, 6818 (2000).
Luo, H., et al., Appl. Phys. Lett. 88,73501 (2006).
Moise, T.S., et al., Appl. Phys. Leu. 66, 27.
Moon, J.S., et al., Appl.Phys Lett., 74 (1999).
Moon, J.S., et al., Appl. Phys.Lett. 87, 183110 (2005).
Ribordy, J.D., et al., Applied Optics. 37, 2272 (1998).
Simmons, J.A., et al., Appl. Phys. vol. 84, 5626 (1998.

* cited by examiner

*Primary Examiner* — Marcos D. Pizarro
*Assistant Examiner* — Suian Tang
(74) *Attorney, Agent, or Firm* — Ladas & Parry (57) ABSTRACT

A photodetector containing a 2DEG layer is disclosed.

12 Claims, 12 Drawing Sheets

Vce (V)

FIG. 8

Vce (V)

UNIPOLAR TUNNELING PHOTODETECTOR

CROSS REFERENCE TO RELATED APPLICATIONS

This application claims the benefit of U.S. Provisional Application No. 60/837,338, filed on Aug. 11, 2006, which is incorporated herein by reference in its entirety.

STATEMENT REGARDING FEDERALLY SPONSORED RESEARCH OR DEVELOPMENT

The present invention was made with support from the United States Government under Grant number NRO000-05-C-0015. The United States Government has certain rights in the invention.

FIELD

The present invention relates to photodetectors. More particularly, the present invention relates to unipolar tunneling photodetectors.

BACKGROUND

Semiconductor photodetectors are widely used for communication, imaging and sensing. For example, photomultiplier tubes (PMTs) are commonly used due to their extremely high internal photo-multiplication gain of an order of $10^6$ and noise-equivalent-power (NEP) of $0.5 \times 10^{-15}$ W/Hz$^{1/2}$. However, the drawbacks of the PMTs are that that quantum efficiency (QE) is generally low, at about 20%, and PMTs need to be operated at over 1000 V electrical bias, thereby making the system utilizing the PMTs complex. In another example, avalanche photodiodes (APDs) in Si, InGaAs(P) or HgCdTe, offer a gain of ~100 and NEP in the range of $10–100 \times 10^{-15}$ W/Hz$^{1/2}$ at DC bias of about ~100 V.

Further, heterojunction bipolar phototransistors (HPTs) and resonant tunneling diodes (RTDs) have also been used as photodetectors. HPTs show responsivity of about 1000 A/W when fabricated in InGaAs/InP material system and RTDs show responsivity of about 10 A/W and 3 dB bandwidth of 1.5 GHz at 1.55 μm.

To obtain photodetectors that offer photon detection with a high gain, sensitivity at low illumination light levels and with better dynamic range of detection, the present disclosure presents a new photodetector design that employs a built-in tunneling structure to perform as an internal gain mechanism for photon detection.

PRIOR ART

Examples of prior art include:
S. M. Sze, Physics of Semiconductor Devices, 2$^{nd}$ ed. (John Wiley & Sons. Inc, 1981)
Hamamatsu photomultiplier tube specification sheet (Hamamatus Corp.)
G. Ribordy, J.-D. Gautier, H. Zbinden, and N. Gisin, Applied Optics. 37, 2272 (1998); P. Hiskeu et al., Applied Optics. 39, 6818 (2000), references therein.
M. N. Abedin, T. F. Refaat, O. V. Sulima, and U. N. Singh, IEEE Trans. Electon. Devices. 51, 2013 (2004); References therein.
J. C. Campbell, A. G. Dentai, C. A. Burrus, and J. F. Ferguson, IEEE J. Quant. Electron., 17, 264 (1981)
H. Luo, D. Ban, H. C. Liu, Z. R. Wasilewski. and M. Buchanan, Appl. Phys. Lett. 88, 73501 (2006)
T. S. Moise, Y.-C. Kao, L. D. Garrett, and J. C. Campbell, Appl. Phys. Leu. 66, 27 (1995)
J. C. Blakesley et al., Phys, Rev. Lett, 94, 67401 (2005)
P. Bhattacharya et al., Appl. Phys. Left. 86, 191106 (2005)
[10] J. S. Moon et al. Appl. Phys. Lett. 87, 183110 (2005)
J. P. Eisenstein, L. N. Pfeiffer, and K. W. West, Appl Phys. Lett. 57, 2324 (1990); J. A. Simmons, M. A. Blount, J. S. Moon, S. K. Lyo, W. E. Baca, J. R. Wendt, J. L. Reno, and M. 1. Hafich, J, Appl. Phys. Vol. 84, 5626 (1998); J. S. Moon, 1. A. Simmons, M. A. Blount, J. Reno, and M. Hafich, Appl. Phys. Lett., 74, (1999).

The detector was illuminated from the frontside through the thick collector metal on top of the mesa. About 36% of the detector's mesa, area is illuminated.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

Using techniques disclosed in this application, a unipolar photodetector utilizing a built-in tunneling structure to serve as an internal gain mechanism for photon detection may be implemented. The tunnel junction photoetectors disclosed in the present application offer a responsivity of about 2500 A/W at room temperature and at wavelength of 1.3 μm and a DC bias of about 0.5 V. The tunnel junction photoetectors disclosed in the present application may be fabricated using, for example, InP, GaAs, GaN, InGaAs, InAs, GaSb or SiGe materials.

Figure 1:
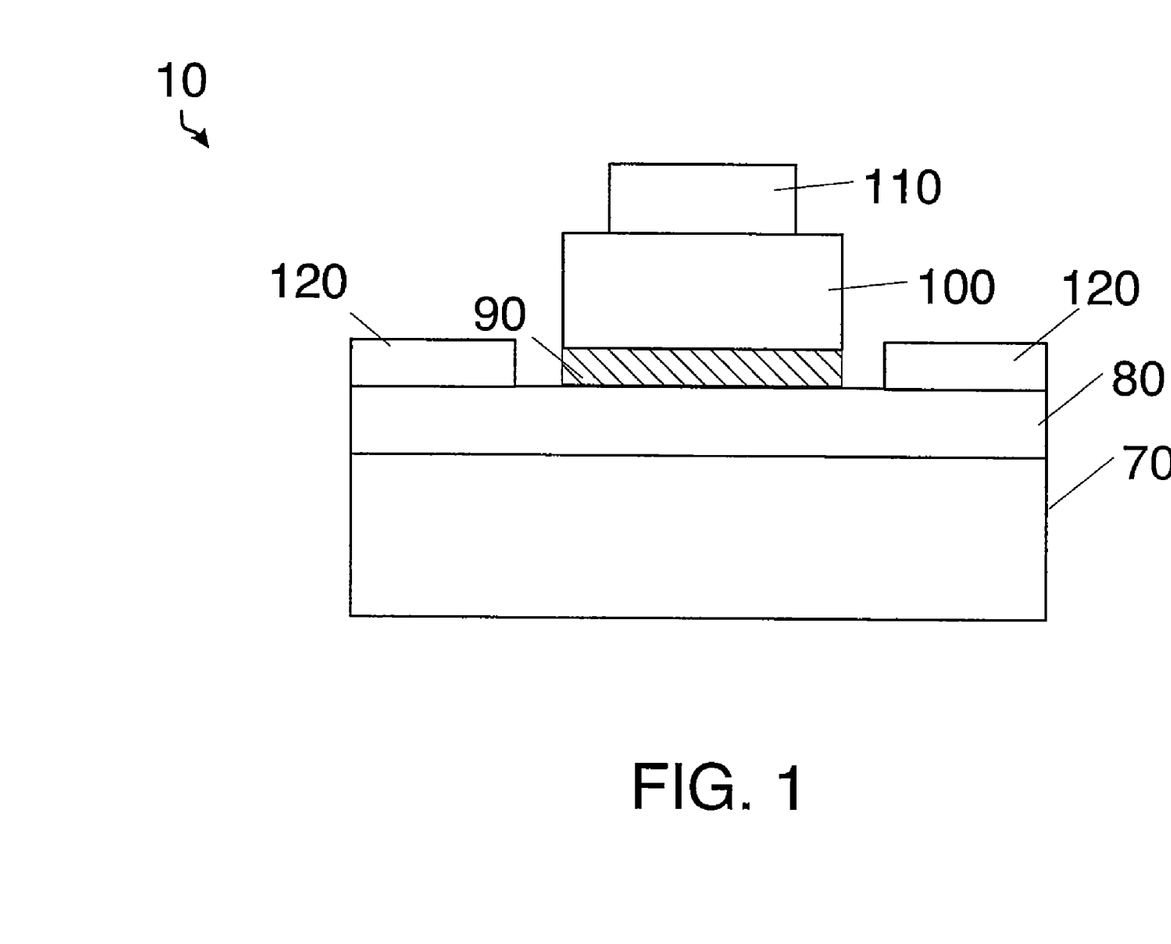
FIG. 1 depicts an exemplary embodiment of a photodetector according to the present disclosure.

In one exemplary embodiment according to the present disclosure, a two-dimensional electron gas (2DEG) layer 80 may be used in a unipolar photodetector 10 shown in FIG. 1. 2DEG layer 80 is a sheet of electron layer confined within quantum well heterostructures. The quantum well heterostructures consist of multiple thin semiconductor layers stacked together in a sequence of wide-band gap material layer/narrowband gap material layer/wideband gap material layer. The doping of the semiconductor layers may be provided by delta-doping at the wideband gap semiconductor layer. The channel doping density of the 2DEG layer 80 is about $1E^{11} \sim 1E^{13}/cm^2$.

Figure 1A:
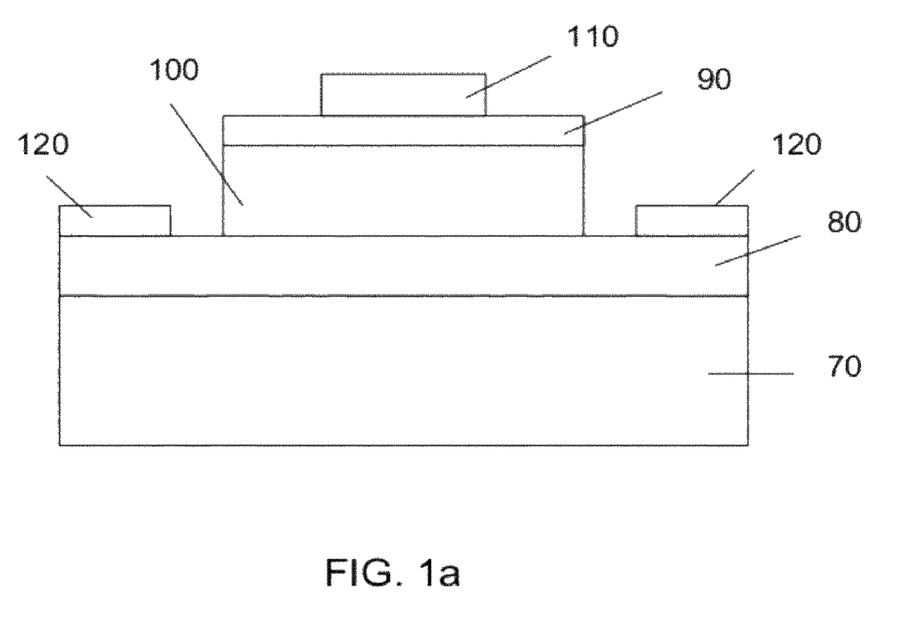
FIG. 1a depicts an exemplary embodiment of a photodetector according to the present disclosure.

The photodetector 10 according to the present disclosure contains 2DEG layer 80 formed on a substrate layer 70, a tunneling junction layer 90 formed on the 2DEG layer 80, an absorber layer 100 formed on the tunneling junction layer 90, and a collector layer 110 formed on the absorber layer 100. The photodetector 10 may further contain electrodes 120 formed on the 2DEG layer 80 and composed, for example, Ti/Pt/Au material. It should be made clear that the tunneling junction 90 can be formed on the absorber layer 100 as shown in FIG. 1*a* for the photodetector 10 to work according to the present disclosure. The collector layer 110 may contain n+ doped material such as, for example, silicon (Si). The tunnel junction layer 90 may be composed of, for example, AlAs/In$_{.52}$Al$_{.48}$As/In$_{.53}$Ga$_{.47}$As/AlAs/In$_{.52}$Al$_{.48}$As material of about 145 Å in thickness. The absorber layer 100 may be formed using either a single band gap material such as, for example, InGaAs of about 1000 Å or using step-graded superlattice containing, for example, InGaAs material.

Photon detection of the photodetector 10 is based on band-to-band absorption in the absorber layer 100. The photo-excited holes or electrons transit, accumulated in the absorber layer 100 and modulate the tunneling current through photovoltaic operation. The spatial separation between tunneling junction layer 90 and in the absorber layer 100 may be engineered to provide an extreme sensitivity down to single photon detection. The detection wavelength can be set by the bandgap of photon in the absorber layer 100. Positioning 2DEG layer 80 closely to the tunneling junction layer 90 enhances the sensitivity of the photodetector 10.

Figure 2:
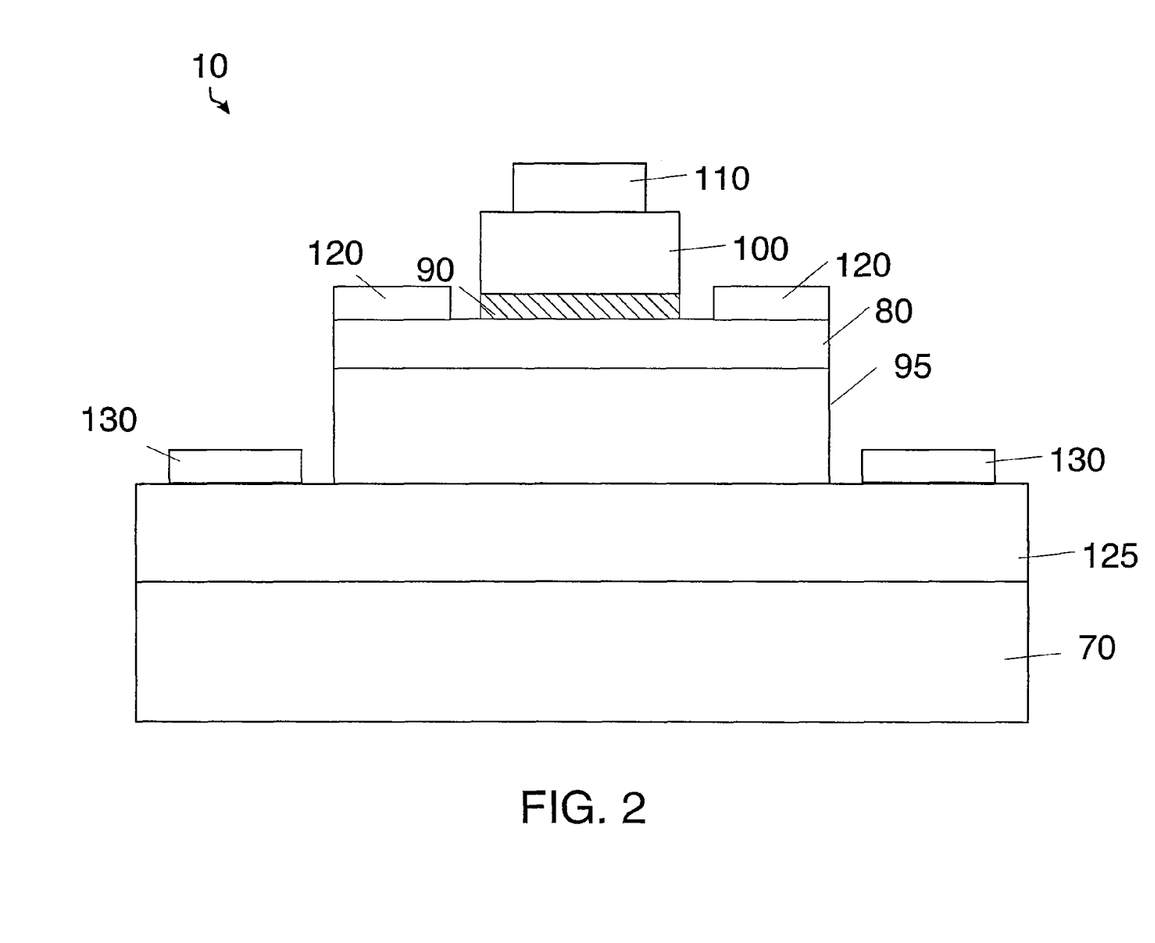
FIG. 2 depicts another exemplary embodiment of a photodetector according to the present disclosure.

In another exemplary embodiment, the photodetector 10 may further contain a gate layer 125 and a spacer layer 95 between the 2DEG layer 80 and the substrate layer 70 as shown in FIG. 2. The gate layer 125 may further contain electrodes 130 composed of, for example, Ti/Pt/Au material. The gate layer 125 may contain, for example, n+ doped material such as InAlAs. Applying voltage to the electrodes 30 of the gate layer 125 may control the sensitivity of the 2DEG layer 80.

Figure 4:
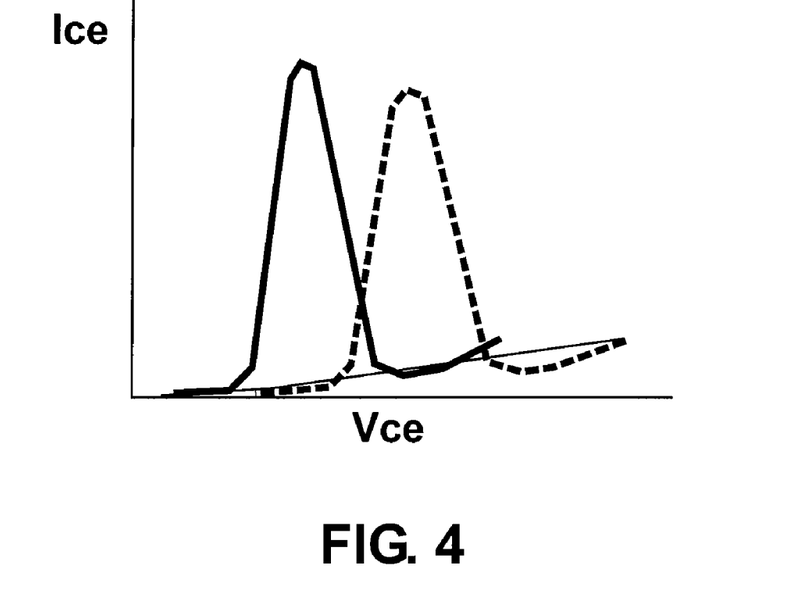
FIG. 4 depicts a photo-response of the photodetector in FIG. 2.
Figure 5:
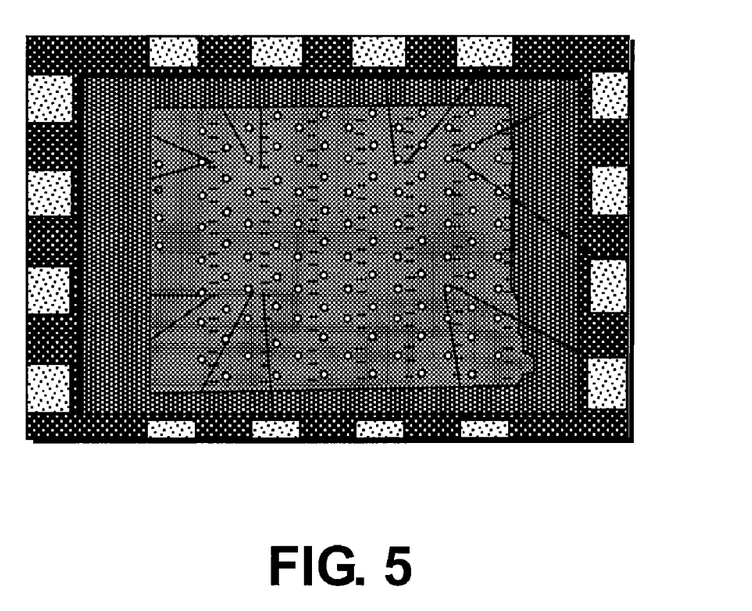
FIG. 5 depicts a fabricated tunnel-junction-based photodetectors packaged into an integrated circuit (IC) package.
Figure 6:
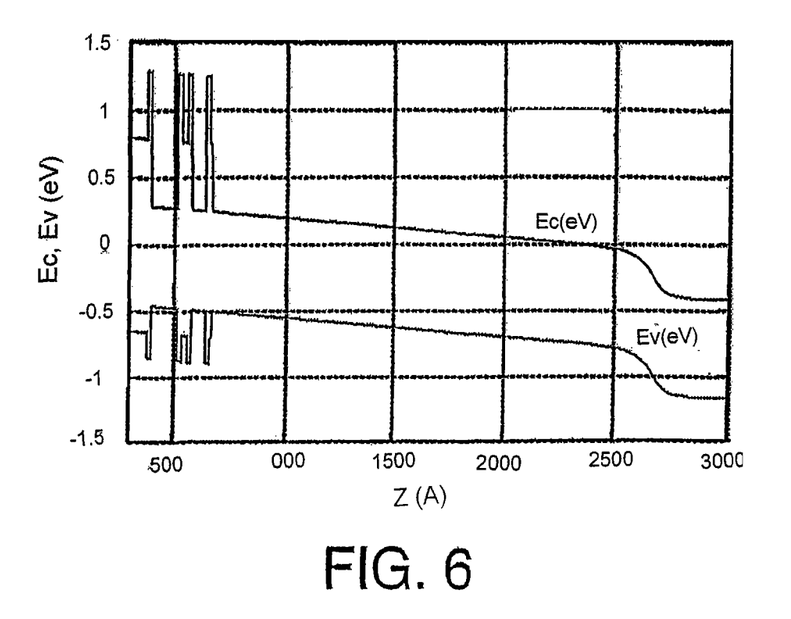
FIG. 6 depicts a calculated conduction and balance band structures for the photodetector in FIG. 2.
Figure 7:
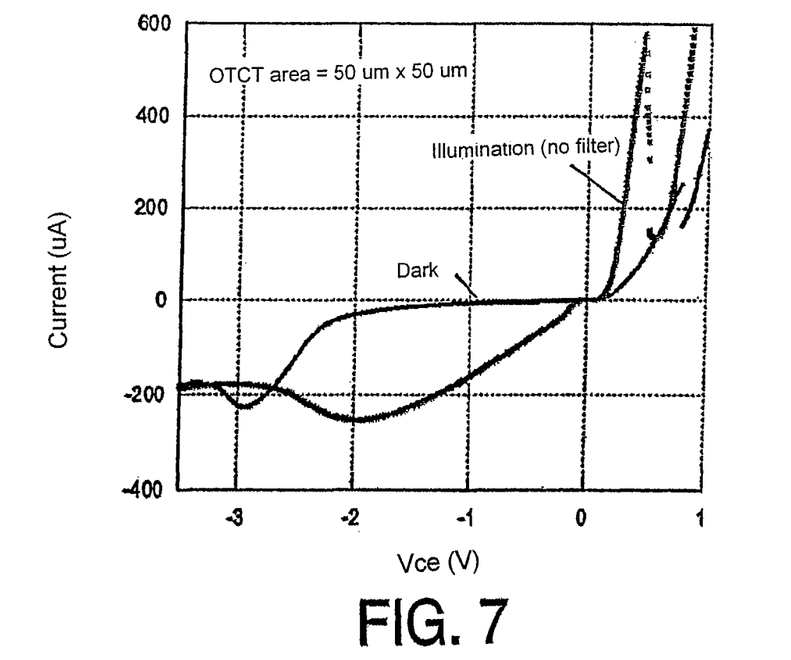
FIG. 7 depicts an increased optical response of the photodetector in FIG. 2.
Figure 8:
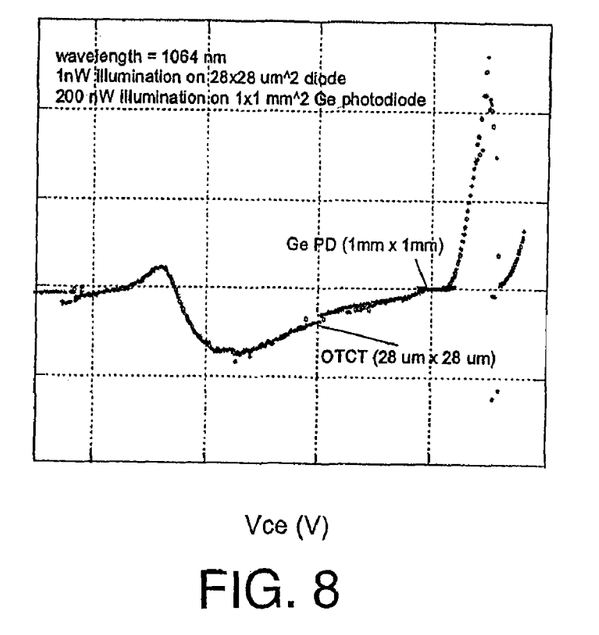
FIG. 8 compares photocurrent of photodetector in FIG. 2 with photocurrent of Ge photodiode at wavelength of $\lambda$=1064 nm.
Figure 9:
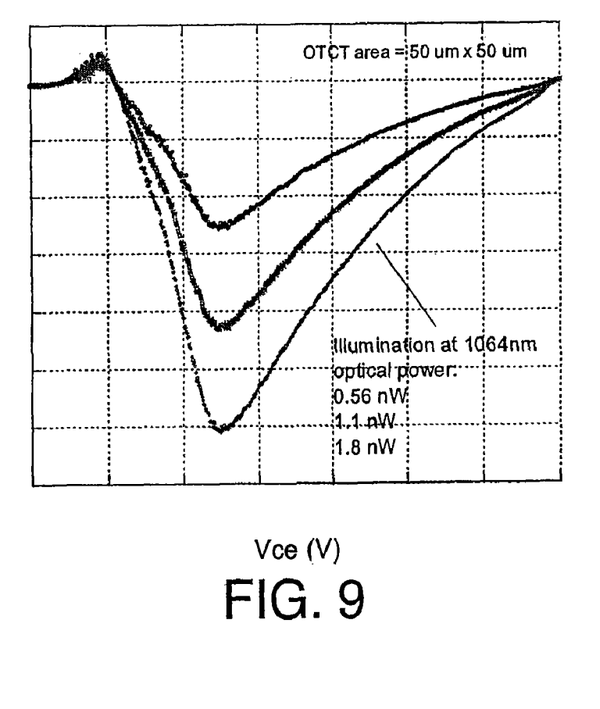
FIG. 9 depicts measured photocurrent of photodetector in FIG. 2 versus illimination intensity in reversed biased.
Figure 10:
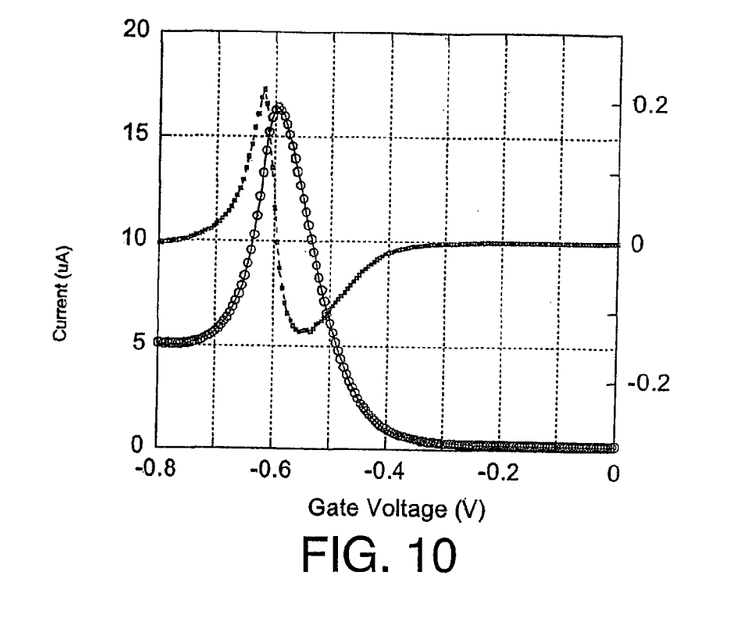
FIG. 10 depicts measured room-temperature collector current and transconductance versus gate voltage at Vce=25 mV of the photodetector in FIG. 2.
Figure 11:
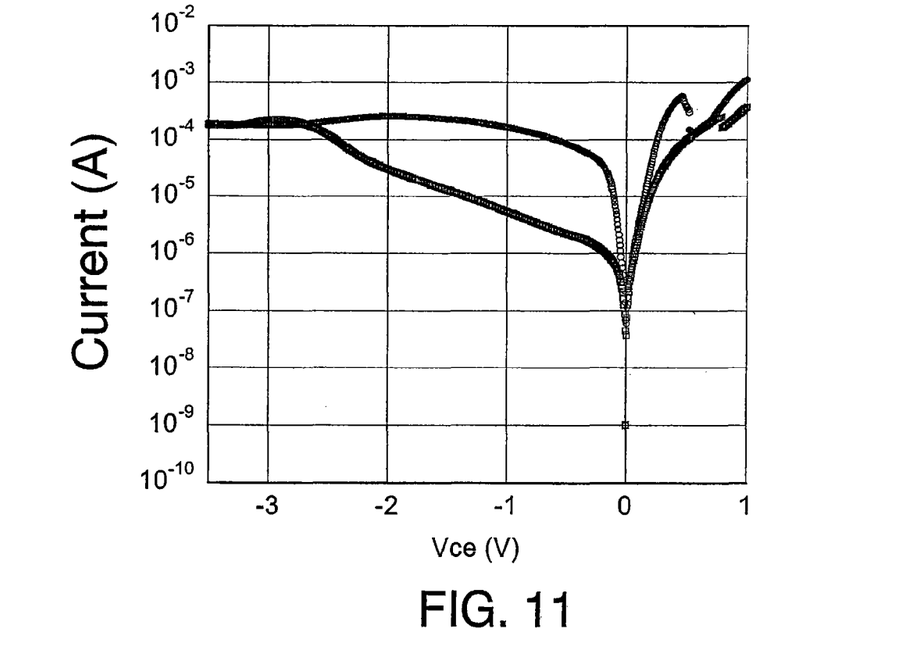
FIG. 11 depicts measured room-temperature tunneling current-voltage characteristics in dark and under light illumination.
Figure 12:
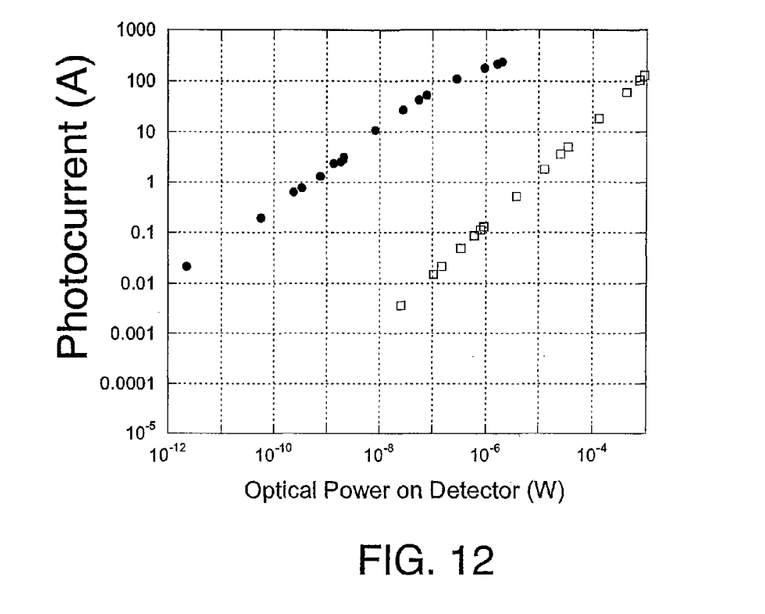
FIG. 12 depicts measured room-temperature photocurrent versus optical power illumination on INGaAAs PIN diode and tunnel-junction photodetector.
Figure 13:
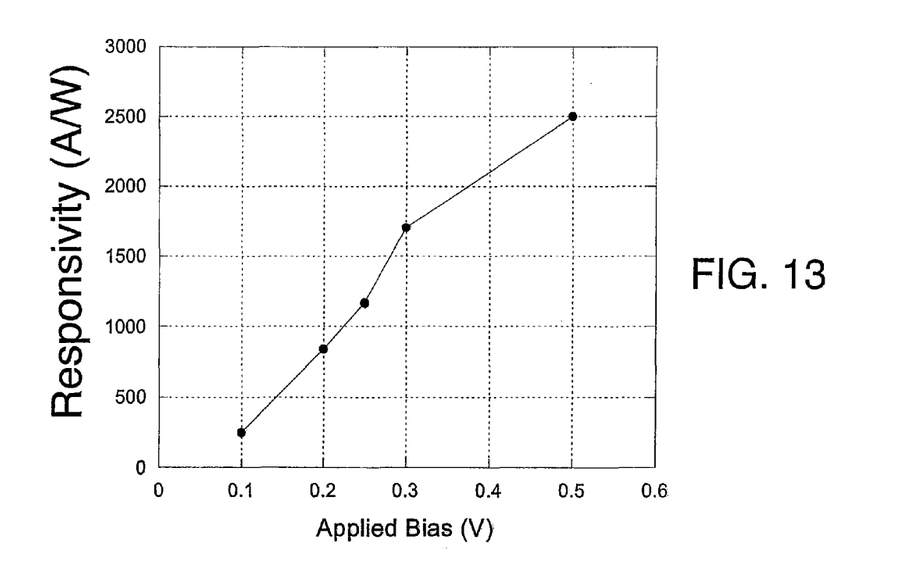
FIG. 13 depicts measured room-temperature optical responsivity of the tunnel-junction photodetectos at different DC biases.
Figure 14:
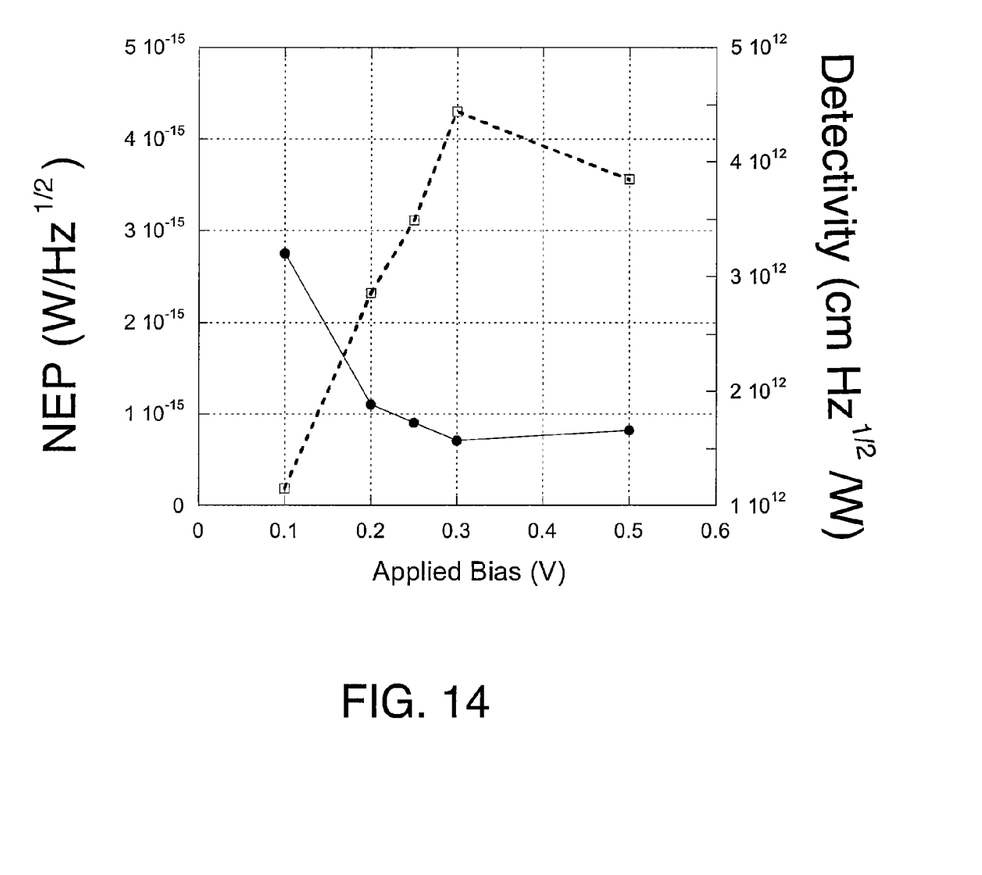
FIG. 14 depicts an estimated NEP and detectivity of the tunnel-junction photodetectors at of $\lambda$=1.3 μm.

FIG. 4 depicts a photo-response of the photodetector 10 according to the present application. The shift of the tunneling peak voltage is due to accumulated holes near the tunneling junction of the photodetector 10. FIG. 5 depicts fabricated tunnel-junction-based photodetectors packaged into an integrated circuit (IC) package. FIG. 6 depicts a calculated conduction and balance band structures for the photodetector 10 disclosed herein. FIG. 7 depicts an increased optical response of the photodetector 10 that is due to no-filetring light illumination. FIG. 8 compares photocurrent of photodetector 10 with photocurrent of Ge photodiode at wavelength of λ=1064 nm. FIG. 9 shows measured photocurrent of photodetector 10 versus illumination intensity in reversed biased. FIG. 10 is a measured room-temperature collector current and transconductance (dotted line) versus gate voltage at Vce=25 mV of the photodetector 10. FIG. 11 is a measured room-temperature tunneling current-voltage characteristics in dark and under light illumination. FIG. 12 is a measured room-temperature photocurrent versus optical power illumination on INGaAAs PIN diode (open square) and tunnel-junction photodetector (filled circle) wherein the wavelength of the laser diode is 809 nm and the mesa dimension of the tunnel-junction detector is 110×110 μm². FIG. 13 is a measured room-temperature optical responsivity of the tunnel-junction photodetectos at different DC biases. FIG. 14 is an estimated NEP and detectivity of the tunnel-junction photodetectors at of λ=1.3

Figure 3:
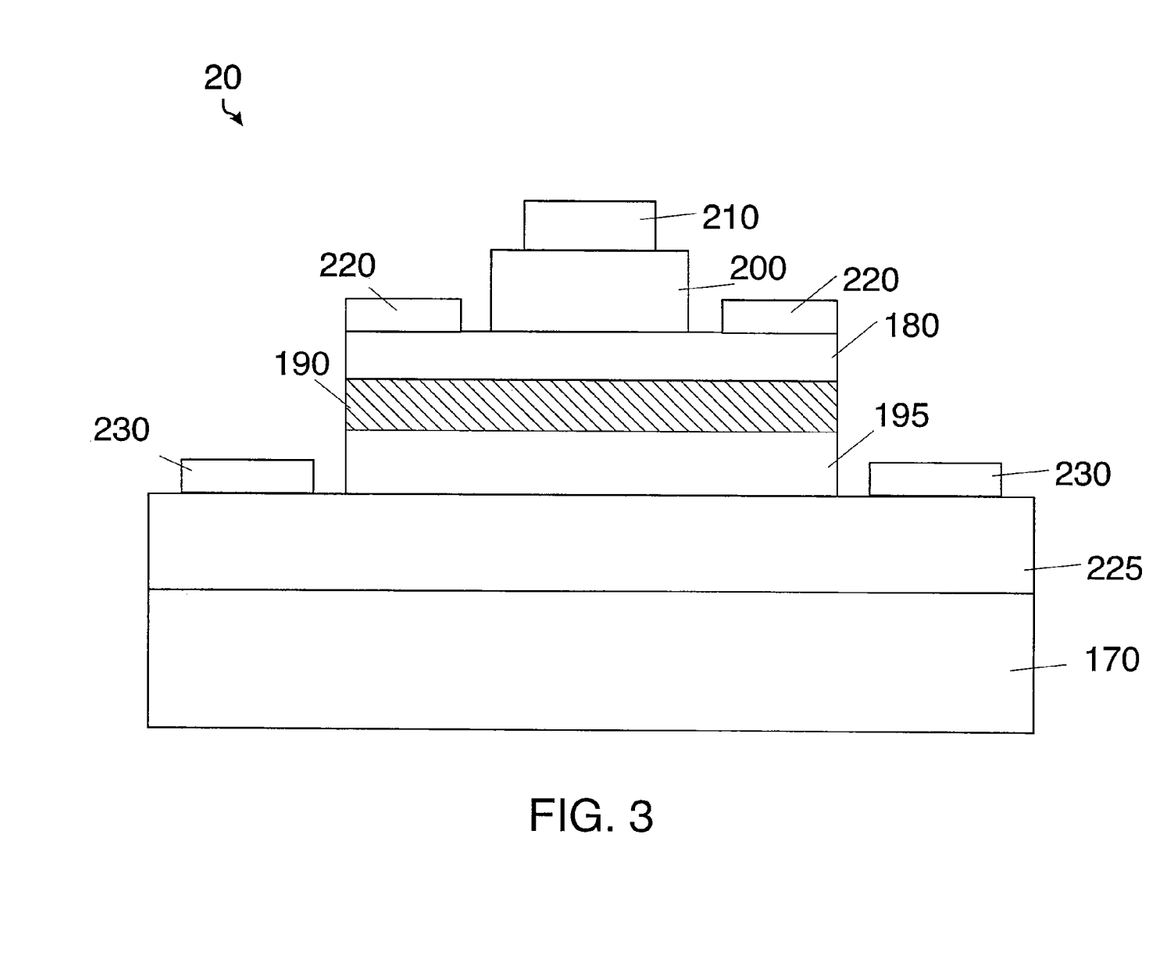
FIG. 3 depicts another exemplary embodiment of a photodetector according to the present disclosure.

In another exemplary embodiment according to the present disclosure, a two-dimensional electron gas (2DEG) layer 180 may be used in a unipolar photodetector 20 shown in FIG. 3. The photodetector 20 according to the present disclosure contains a collector layer 225 formed on a susbtrate 170, an absorber layer 195 formed on the collector layer 225, a tunneling junction layer 190 formed on the absorber layer 195, a 2DEG layer 180 formed on the tunneling junction layer 190, a spacer layer 200 formed on the a 2DEG layer 180, and an electrode 210 formed on the spacer layer 200.

The photodetector 20 may further contain electrodes 220 formed on the 2DEG layer 180 and electrodes 230 formed on the collector layer 225 wherein the electrodes 220, 230 may be composed of, for example, Ti/Pt/Au material. It should be made clear that the absorber layer 195 may be formed on the tunneling junction 190 for the photodetector 20 to work according to the present disclosure. The collector layer 225 may contain n+ doped material such as, for example, silicon (Si). The tunnel junction layer 190 may be composed of, for example, AlAs/In$_{.52}$Al$_{.48}$As/In$_{.53}$Ga$_{.47}$As/AlAs/In$_{.52}$Al$_{.48}$As material of about 145 Å in thickness. The absorber layer 195 may be formed using either a single bad gap material such as, for example, InGaAs of about 1000 Å or using step-graded superlattice containing, for example, InGaAs material. The electrode 210 may contain, for example, Pt/Au material.

Photon detection of the photodetector 20 is based on band-to-band absorption in the absorber layer 195. The photo-excited holes or electrons transit, accumulated in the absorber layer 195 and modulate the tunneling current through photovoltaic operation. The spatial separation between tunneling junction layer 190 and in the absorber layer 195 may be engineered to provide an extreme sensitivity down to single photon detection. The detection wavelength can be set by the bandgap of photon in the absorber layer 195. Positioning 2DEG layer 180 closely to the tunneling junction layer 190 enhances the sensitivity of the photodetector 20.

Manufacturing of photodetectors 10 and 20, described above, may include steps such as:

1) CMET Definition
2) MESA Etch using etch-stop layer
3) Ohmic metal depostion and alloy process
4) Mesa Etch
5) Gate metal formation (optional)
6) Device Isolation In one exemplary embodiment, the collector layer 110 of the photodetector 10 may comprise, for example, In$_{.53}$Ga$_{.47}$As:Si that is about 1000 Å, In$_{.53}$Ga$_{.47}$As:Ud that is about 100 Å, or In$_{.53}$Ga$_{.47}$As:Ud that is about 500 Å. The tunneling junction layer 90 of the photodetector 10 may comprise, for example, In$_{.53}$Ga$_{.47}$As:Ud that is about 50 Å, AlAs:

Ud that is about 15 Å, or InAlAs:Ud that is about 25 Å. The 2DEG layer 80 of the photodetector 10 may comprise, for example, $In_{.53}Ga_{.47}As$:Ud that is about 120 Å, or $In_{.52}Ga_{.48}As$:Ud that is about 50 Å.

Figure 15:
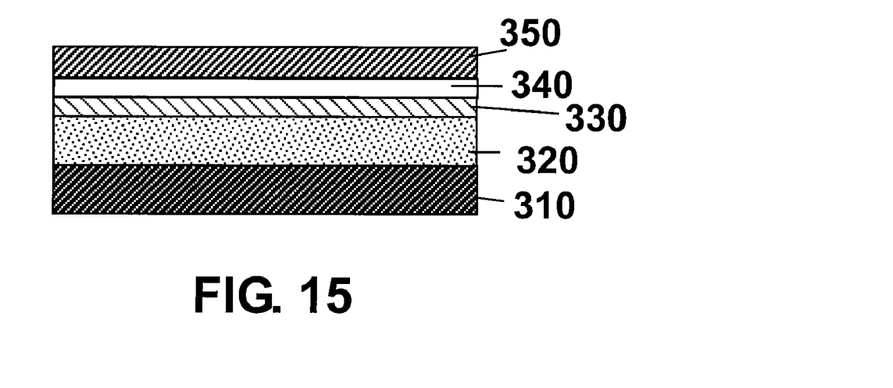
FIGS. 15-20 depict exemplary fabrication steps for fabricating the photodetector according to the present disclosure.
Figure 16:
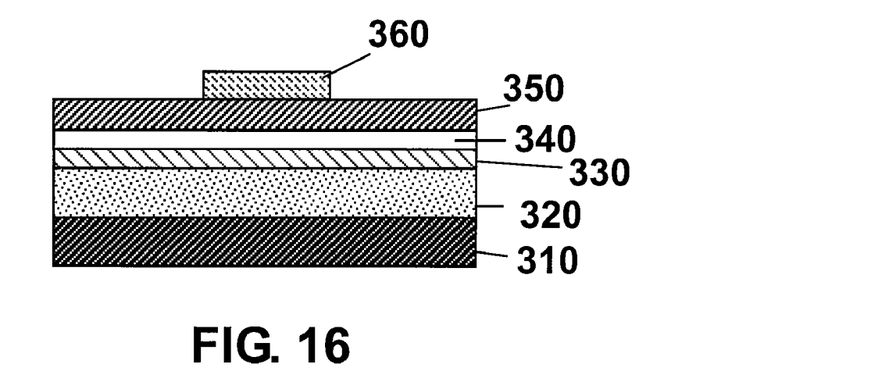
Figure 17:
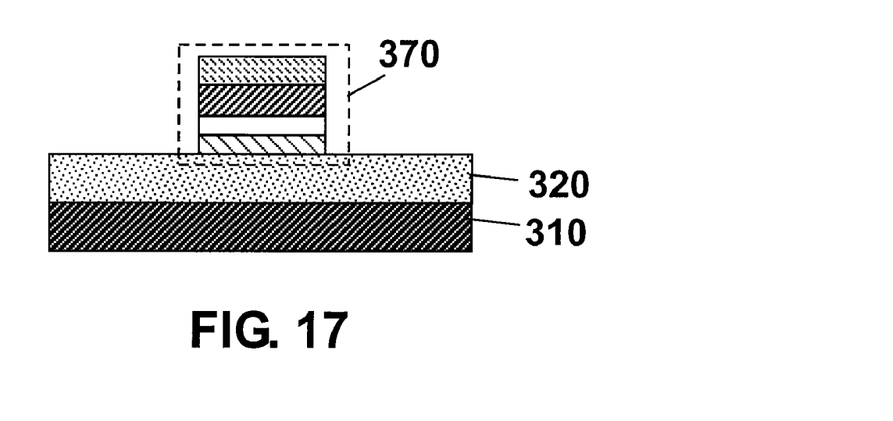
Figure 18:
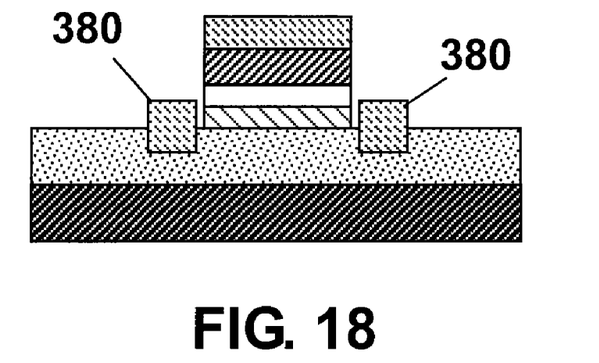
Figure 19:
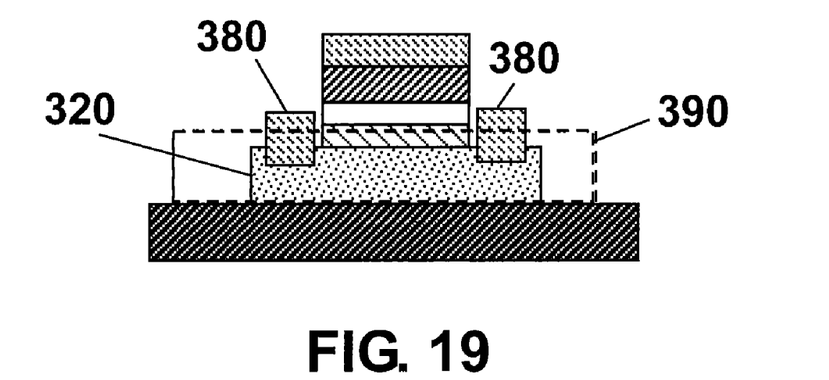
Figure 20:
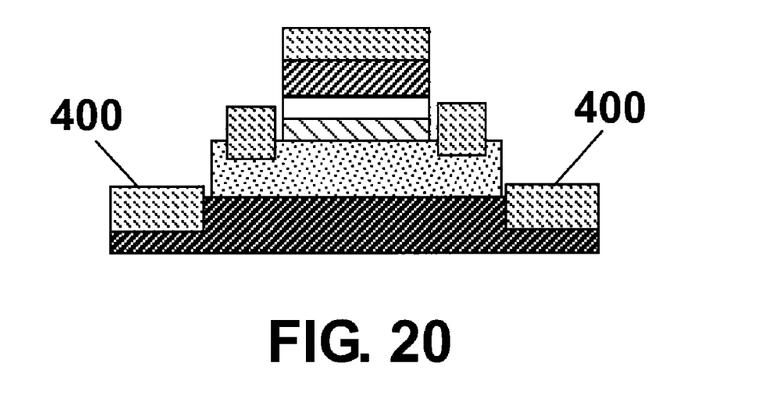

In one exemplary embodiment, referring to FIG. 15, a photodetector according to the present disclosure may be fabricated by depositing a 2DEG layer 320 on a gate layer 310, depositing a tunneling junction layer 330 on the 2DEG layer 320, depositing a spacer layer 340 on the tunneling junction layer 330, and depositing a collector layer 350 on the spacer layer 340. Referring to FIG. 16, a collector metal 360 may be deposited on the collector layer 350. Referring to FIG. 17, collector mesa 370 comprising tunneling junction layer 330, spacer layer 340, collector layer 350 and collector metal 360 may be etched. The collector mesa 370 may be etched using either dry or wet etching the semiconductor materials. Referring to FIG. 18, ohmic metal 380 is deposited on the 2DEG layer 320. The ohmic metal 380 may be formed using shallow ohmic alloying process by alloying the ohmic metal 380 at reduced temperature so as not to diffuse the ohmic metal 380 in a shallow depth. Referring to FIG. 19, 2DEG mesa 390 comprising 2DEG layer 320 is etched. The 2DEG mesa 390 may be etched using either dry or wet etching the semiconductor materials Referring to FIG. 20, gate metal 400 is deposited on the gate layer 310.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "step(s) for . . . ."

What is claimed is:

1. A photodetector comprising:
    an absorber layer formed on a substrate, the absorber layer having a first side and a second side opposite to the first side;
    a 2DEG layer containing at least one electrode formed on the substrate at the first side of the absorber layer;
    a tunneling junction layer formed on the substrate at the first or second side of the absorber layer; and
    a collector layer formed on the substrate at the second side of the absorber layer.

2. The photodetector of claim 1, wherein the tunneling junction layer is formed between the 2DEG layer and the absorber layer.

3. The photodetector of claim 1, wherein the absorber layer is formed between the 2DEG layer and the tunneling junction layer.

4. The photodetector of claim 1, further comprising a gate layer containing at least one electrode formed between the substrate and the 2DEG layer.

5. The photodetector of claim 4, wherein the photodetector is a phototransistor.

6. The photodetector of claim 1, wherein the absorber layer is configured to generate photo-excited carriers upon illumination without means to trap the photo-excited carriers therein.

7. A method for forming a photodetector, the method comprising:
    forming an absorber layer on a substrate, the absorber layer having a first side and a second side opposite to the first side;
    forming a 2DEG layer containing at least one electrode on the substrate at the first side of the absorber layer;
    forming a tunneling junction layer on the substrate at the first or second side of the 2DEG layer;
    forming a collector layer at the second side of the absorber layer on the substrate.

8. The method of claim 7, wherein forming the tunneling junction comprises forming the tunneling junction between the 2DEG layer and the absorber layer.

9. The method of claim 7, wherein forming the absorber layer comprises forming the absorber layer between the tunneling junction layer and the 2DEG layer.

10. A photodetector, comprising:
    an absorber layer operative to generate carriers when being photo-excited;
    a 2DEG layer adjacent to the absorber layer, the 2DEG layer comprising at least one electrode formed thereon;
    a collector layer formed of a heavily doped semiconductor adjacent to the absorber layer; and
    a tunneling junction layer near which the photo-excited carriers accumulate to shift a tunneling peak voltage of the photodetector.

11. The photodetector of claim 10, wherein the absorber layer is formed between the 2DEG layer and the collector layer.

12. The photodetector of claim 10, wherein the absorber layer, the 2DEG layer, the collector layer and the tunneling junction layer are so arranged that a negative photocurrent is detected when a negative biased is applied thereto, and a positive photocurrent is detected when a positive biased is applied.

\* \* \* \* \*